(12) United States Patent
Aoki

(10) Patent No.: US 11,074,931 B1
(45) Date of Patent: Jul. 27, 2021

(54) SUSPENSION ASSEMBLY AND DISK DEVICE

(71) Applicants: Kabushiki Kaisha Toshiba, Tokyo (JP); Toshiba Electronic Devices & Storage Corporation, Tokyo (JP)

(72) Inventor: Kenichiro Aoki, Tokyo (JP)

(73) Assignees: KABUSHIKIKAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/012,236

(22) Filed: Sep. 4, 2020

(30) Foreign Application Priority Data

Mar. 6, 2020 (JP) .............................. JP2020-038797

(51) Int. Cl.
*G11B 5/48* (2006.01)
*G11B 33/02* (2006.01)
*G11B 33/12* (2006.01)

(52) U.S. Cl.
CPC ............ *G11B 5/484* (2013.01); *G11B 5/4813* (2013.01); *G11B 33/027* (2013.01); *G11B 33/125* (2013.01)

(58) Field of Classification Search
None
See application file for complete search history.

(56) References Cited

U.S. PATENT DOCUMENTS

| | | |
|---|---|---|
| 9,236,070 B1 | 1/2016 | Cayaban |
| 9,449,624 B2 | 9/2016 | Arai et al. |
| 9,704,520 B1 | 7/2017 | Nakamura et al. |
| 10,080,279 B2 | 9/2018 | Okuno et al. |
| 2019/0295600 A1 | 9/2019 | Yoshikawa et al. |

FOREIGN PATENT DOCUMENTS

| | | | |
|---|---|---|---|
| JP | 2010272178 A | * 12/2010 | ............. G11B 5/486 |
| JP | 2018163714 A | * 10/2018 | ............. H05K 3/363 |

* cited by examiner

*Primary Examiner* — William J Klimowicz
(74) *Attorney, Agent, or Firm* — White & Case LLP

(57) ABSTRACT

According to one embodiment, a suspension assembly includes a support plate, a wiring member disposed on the support plate, and a head supported on the support plate through the wiring member. The wiring member includes a distal end portion electrically connected to the head, a connection end portion extending outside the support plate, and a plurality of wirings extending between the distal end portion and the connection end portion. The connection end portion includes an opening with predetermined length and width and thirteen or more connection terminals disposed in the opening and arranged at intervals in a direction of the length. A percentage of an area of the opening occupied by areas of the thirteen or more connection terminals is 40% to 65% inclusive.

14 Claims, 10 Drawing Sheets

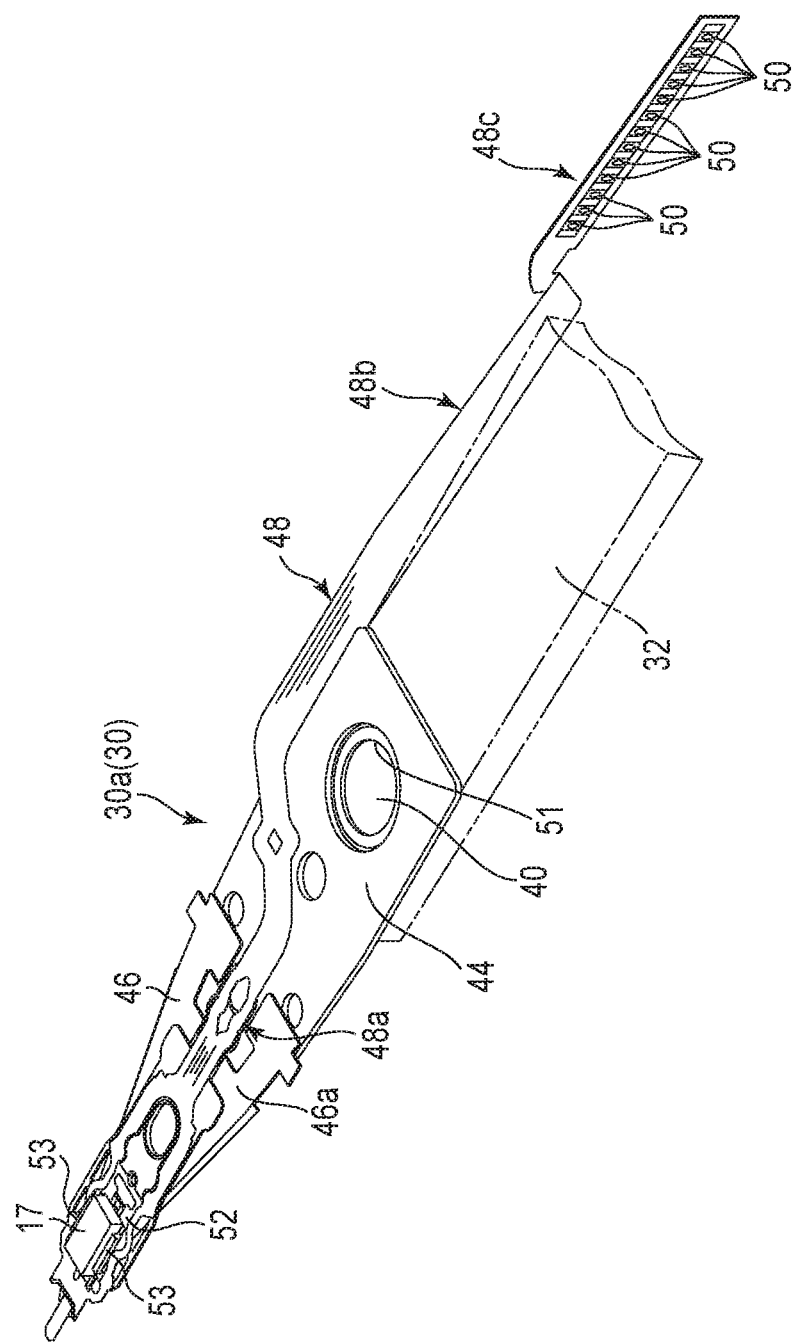
F I G. 3

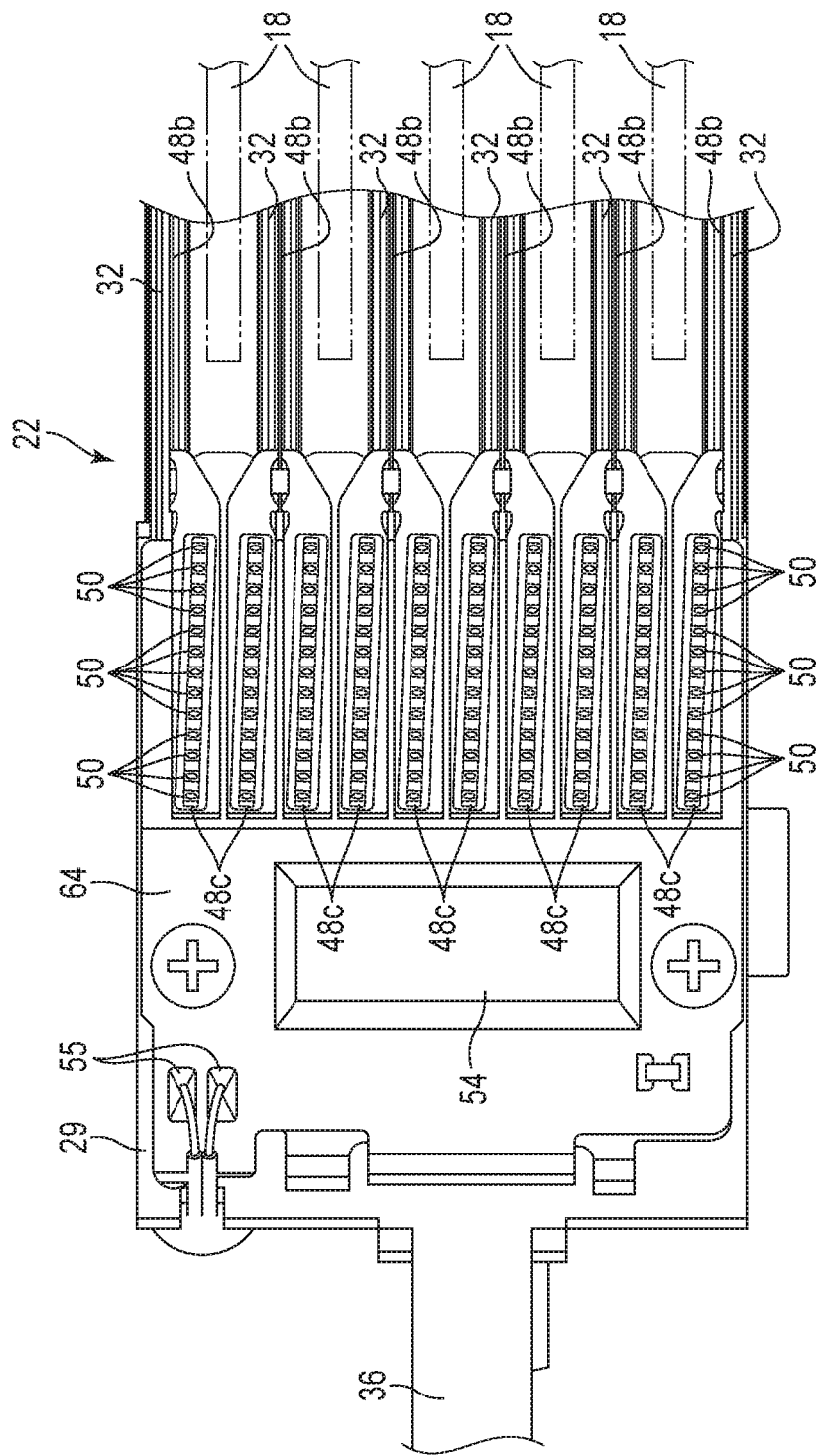
F I G. 4

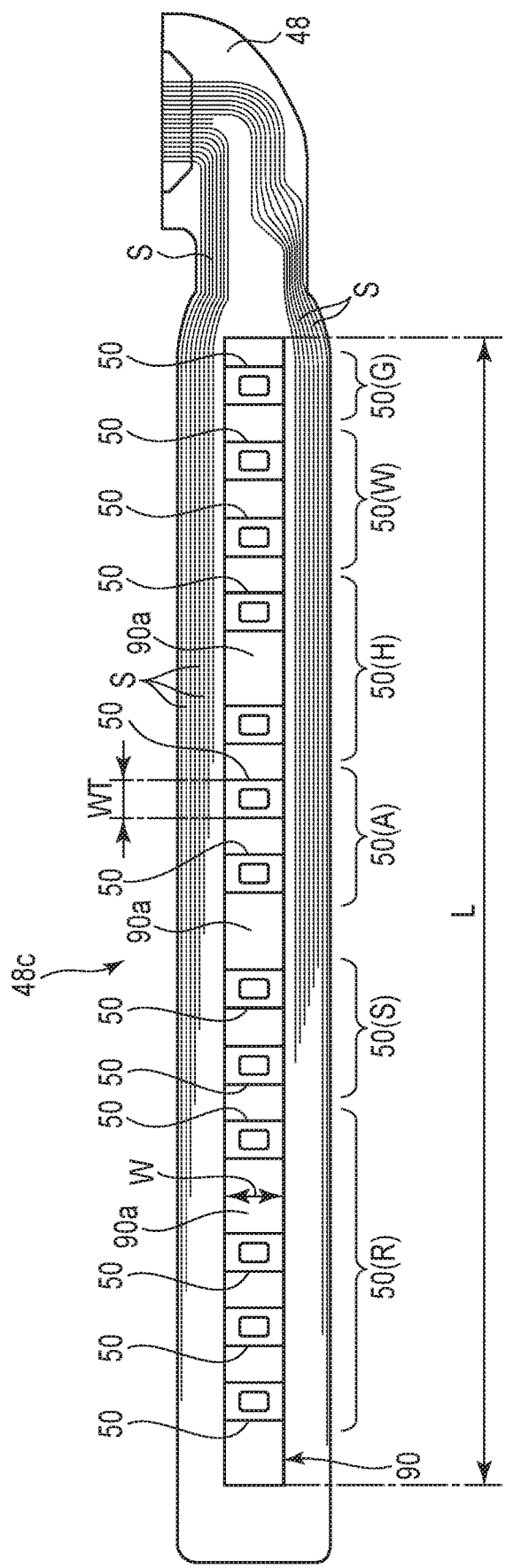
F I G. 7

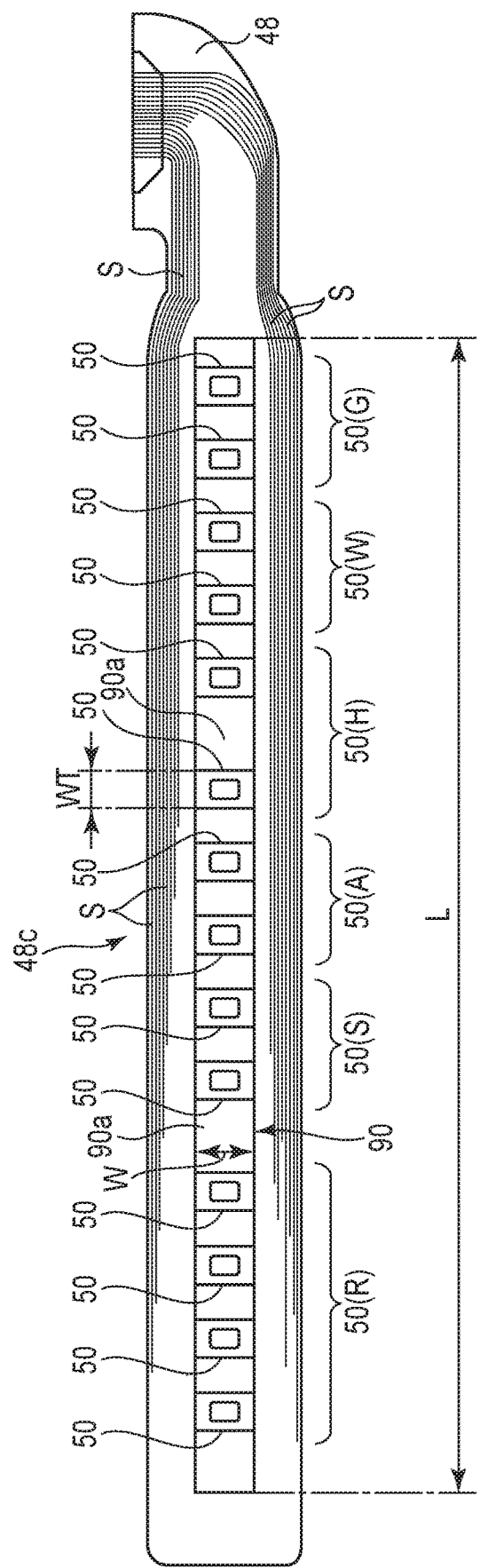
F I G. 10

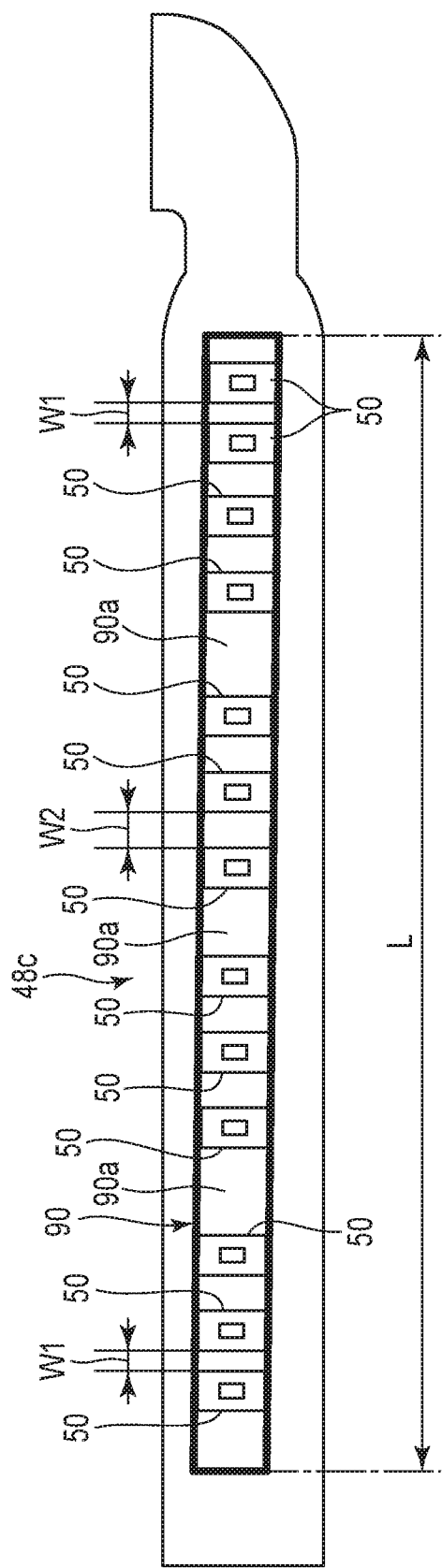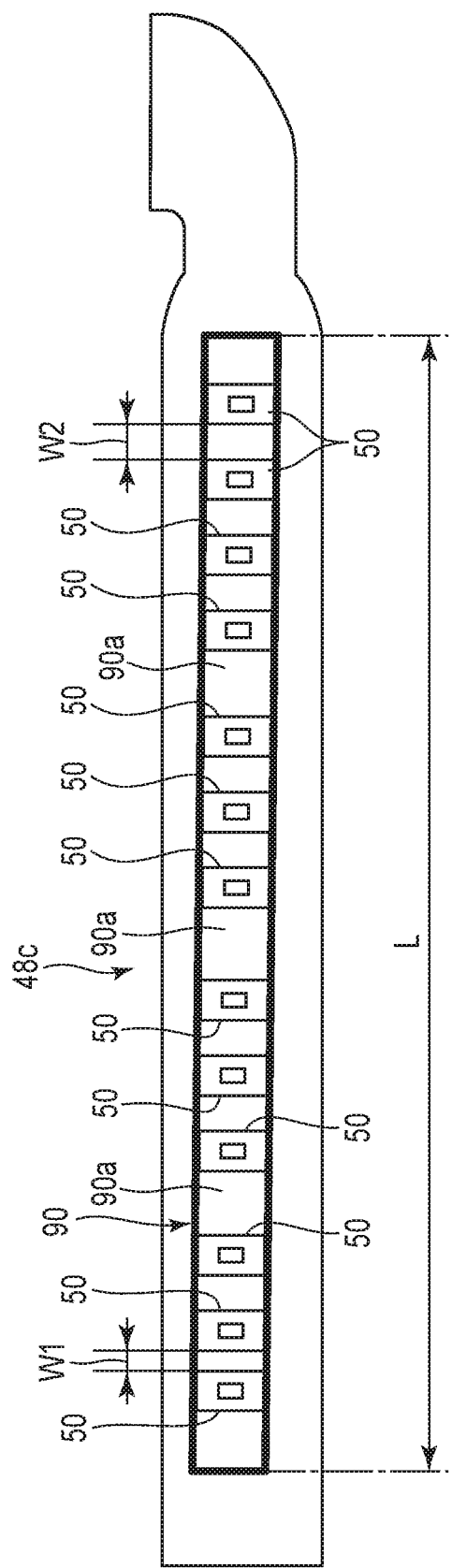
FIG. 11A
FIG. 11B

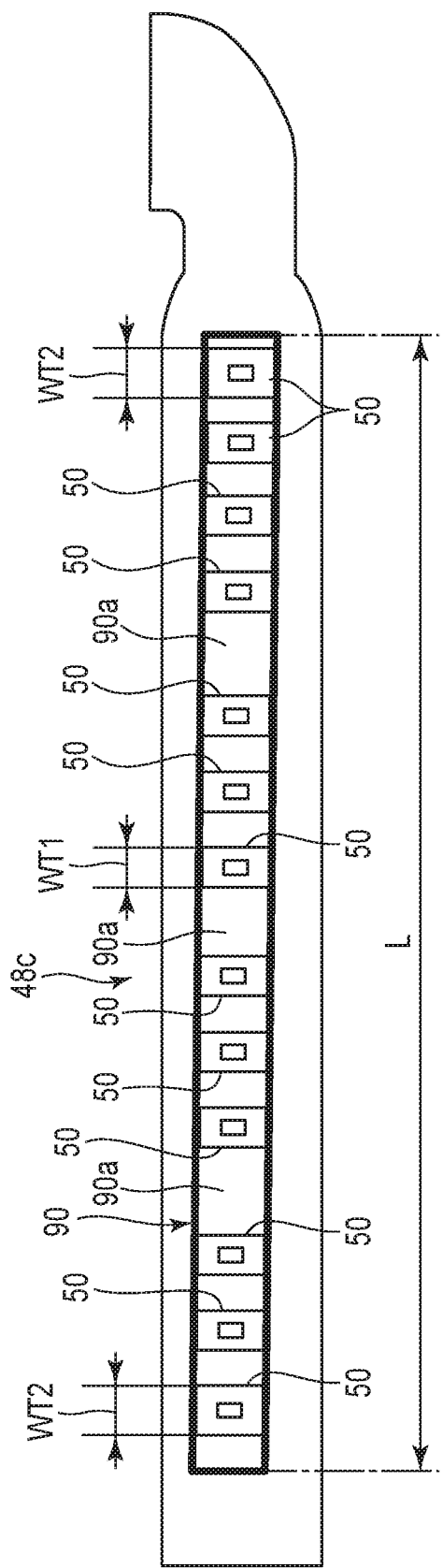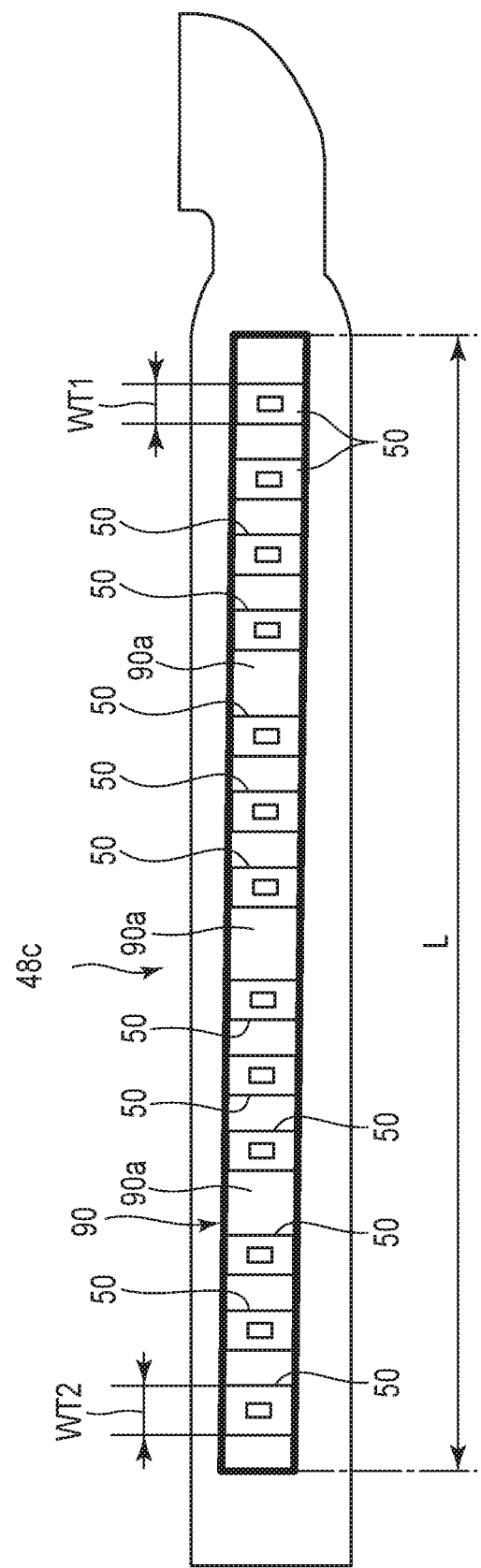

SUSPENSION ASSEMBLY AND DISK DEVICE

CROSS-REFERENCE TO RELATED APPLICATIONS

This application is based upon and claims the benefit of priority from Japanese Patent Application No. 2020-038797, filed Mar. 6, 2020, the entire contents of which are incorporated herein by reference.

FIELD

Embodiments described herein relate generally to a suspension assembly used for a disk device and a disk device including the suspension assembly.

BACKGROUND

A magnetic disk device as an example of the disk device includes magnetic disks disposed in a base, a spindle motor that supports and rotates the magnetic disks, and a head actuator, in general. The head actuator comprises a plurality of suspension assemblies respectively supporting magnetic heads. Each of the suspension assemblies includes a suspension mounted to a distal end portion of an arm of the head actuator and a wiring member (a flexure, a wiring trace) disposed on the suspension. A magnetic head is supported on a gimbal portion of the wiring member to thereby form a head suspension assembly. A plurality of connection terminals are provided at a connection end portion of the wiring member. The connection terminals are electrically connected to the magnetic head via wirings of the wiring member. The connection end portion is solder-joined to a connection pad of a flexible printed circuit board (FPC) provided on an actuator block.

In order to achieve higher density and higher reliability of recent magnetic disk devices, addition of a head disk interface (HDI) sensor, a multi-stage actuator, a dynamic flight height (DFH) control function, and a high frequency assisted recording or heat assisted recording function to each of heads or each of suspension assemblies is being considered. For this purpose, the number of the connection terminals provided at the connection end portion of each of the wiring members needs to be further increased.

BRIEF DESCRIPTION OF THE DRAWINGS

FIG. 3 is a perspective view of a suspension assembly of the actuator assembly.

FIG. 4 is a side view of an actuator block, a joint portion (FPC joint portion) of the FPC unit, and tail connection end portions of flexures of the actuator assembly.

FIG. 7 is a plan view of the tail connection end portion of the flexure.

FIG. 10 is an enlarged plan view of a tail connection end portion of a flexure according to a second embodiment.

FIG. 11A is a schematic plan view of a tail connection end portion of a flexure according to a third embodiment.

FIG. 11B is a schematic plan view of a tail connection end portion of a flexure according to a fourth embodiment.

FIG. 12A is a schematic plan view of a tail connection end portion of a flexure according to a fifth embodiment.

FIG. 12B is a schematic plan view of a tail connection end portion of a flexure according to a sixth embodiment.

DETAILED DESCRIPTION

Various embodiments will be described hereinafter with reference to the accompanying drawings. In general, according to one embodiment, a suspension assembly comprises a support plate; a wiring member disposed on the support plate; and a head supported on the support plate through the wiring member. The wiring member comprises a distal end portion electrically connected to the head, a connection end portion extending outside the support plate, and a plurality of wirings extending between the distal end portion and the connection end portion. The connection end portion includes an opening with predetermined length and width and includes thirteen or more connection terminals disposed in the opening and arranged at intervals in a direction of the length. A percentage of an area of the opening occupied by the sum of areas of the thirteen or more connection terminals is 40% to 65% inclusive.

The disclosure is merely an example and changes made appropriately without departing from the spirit of the invention and a person skilled in the art can easily conceive of are naturally included in the scope of the present invention. Although the drawings are schematic representations of actual modes in some cases with regard to widths, thicknesses, shapes, and the like of respective portions for the sake of clearer explanation, the drawings merely illustrate examples and are not intended to limit interpretation of the present invention. In the present description and the respective figures, components similar to those described already in relation to the already-mentioned drawings will be provided with the same reference signs and will not be described in detail as appropriate in some cases.

First Embodiment

As a disk device, a hard disk drive (HDD) according to the first embodiment will be described in detail.

Figure 1:
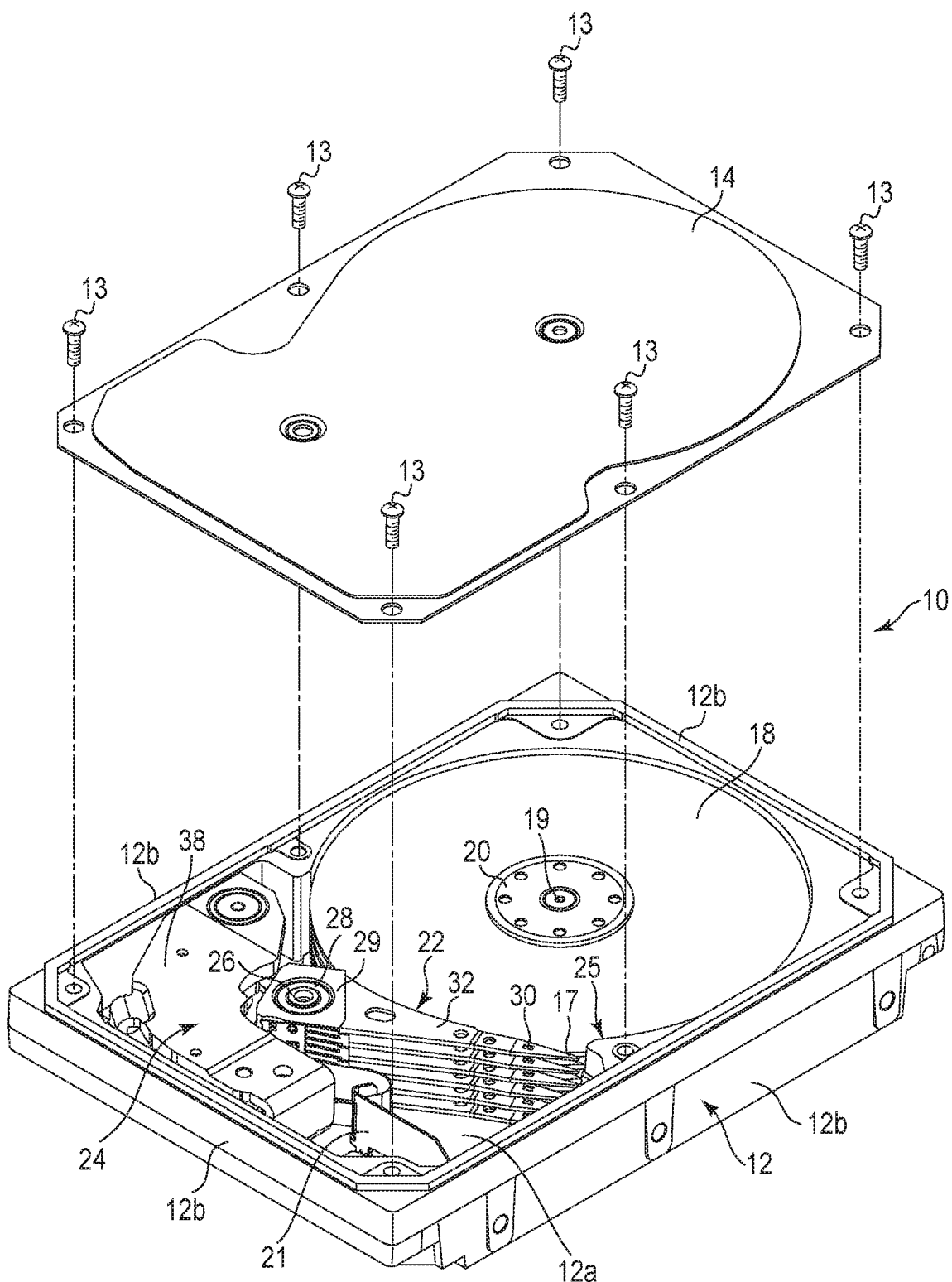
FIG. 1 is an exploded perspective view of a hard disk drive (HDD) according to a first embodiment.

FIG. 1 is an exploded perspective view of the HDD according to the first embodiment with a detached top cover.

The HDD comprises a housing 10 in a flat and substantially rectangular shape. The housing 10 comprises a base 12 in a shape of an open-top rectangular box and a top cover 14. The base 12 comprises a bottom wall 12a in a rectangular shape and facing the top cover 14 with a clearance from the top cover 14, and a plurality of side walls 12b standing along a peripheral edge of the bottom wall, and the base 12 is integrally molded of aluminum, for example. The top cover 14 is formed in a rectangular plate shape by use of stainless steel, for example. The top cover 14 is fixed to tops of the side walls 12b of the base 12 by use of a plurality of screws 13 to close a top opening of the base 12.

In the housing 10 are provided a plurality of magnetic disks 18 as recording media and a spindle motor 19 as a drive unit that supports and rotates the magnetic disks 18.

The spindle motor 19 is disposed on the bottom wall 12a. Each of the magnetic disks 18 is 3.5 inches, for example, and includes a magnetic recording layer on an upper face and/or a lower face. The respective magnetic disks 18 are coaxially fitted with a hub (not shown) of the spindle motor 19 and fixed to the hub by clamping with a clamp spring 20. The respective magnetic disks 18 are supported in such positions as to be parallel to the bottom wall 12a of the base 12. The plurality of magnetic disks 18 are rotated at a predetermined rotation speed by the spindle motor 19. Although the five magnetic disks 18, for example, are housed in the housing 10 in the present embodiment, the number of the magnetic disks 18 is not limited to five.

In the housing 10 are provided a plurality of magnetic heads 17 that carry out recording and reading of information on and from the magnetic disks 18 and an actuator assembly (carriage assembly) 22 which supports the magnetic heads 17 to be movable with respect to the magnetic disks 18. In the housing 10, a voice coil motor (hereinafter referred to as "VCM") 24 that rotates and positions the actuator assembly 22, a ramp load mechanism 25 that retains the magnetic heads 17 in unload positions separate from the magnetic disks 18 when the magnetic heads 17 move to outermost peripheries of the magnetic disks 18, and a board unit (FPC unit) 21 mounted with electronic components such as a conversion connector are provided.

The actuator assembly 22 comprises an actuator block 29 supported by a bearing unit 28 to be rotatable about a support shaft 26, a plurality of arms 32 extending from the actuator block 29, and suspension assemblies 30 extending from the respective arms 32. The magnetic heads 17 are supported on distal end portions of the respective suspension assemblies 30. The support shaft 26 stands on the bottom wall 12a. Each of the magnetic heads 17 includes a read head, a write head, an assisting element, a heater, and the like.

To an outer face of the bottom wall 12a of the base 12, a printed circuit board (not shown) is fixed by screws. The printed circuit board forms a control unit that controls operation of the spindle motor 19 and operation of the VCM 24 and the magnetic heads 17 via the board unit 21.

Figure 2:
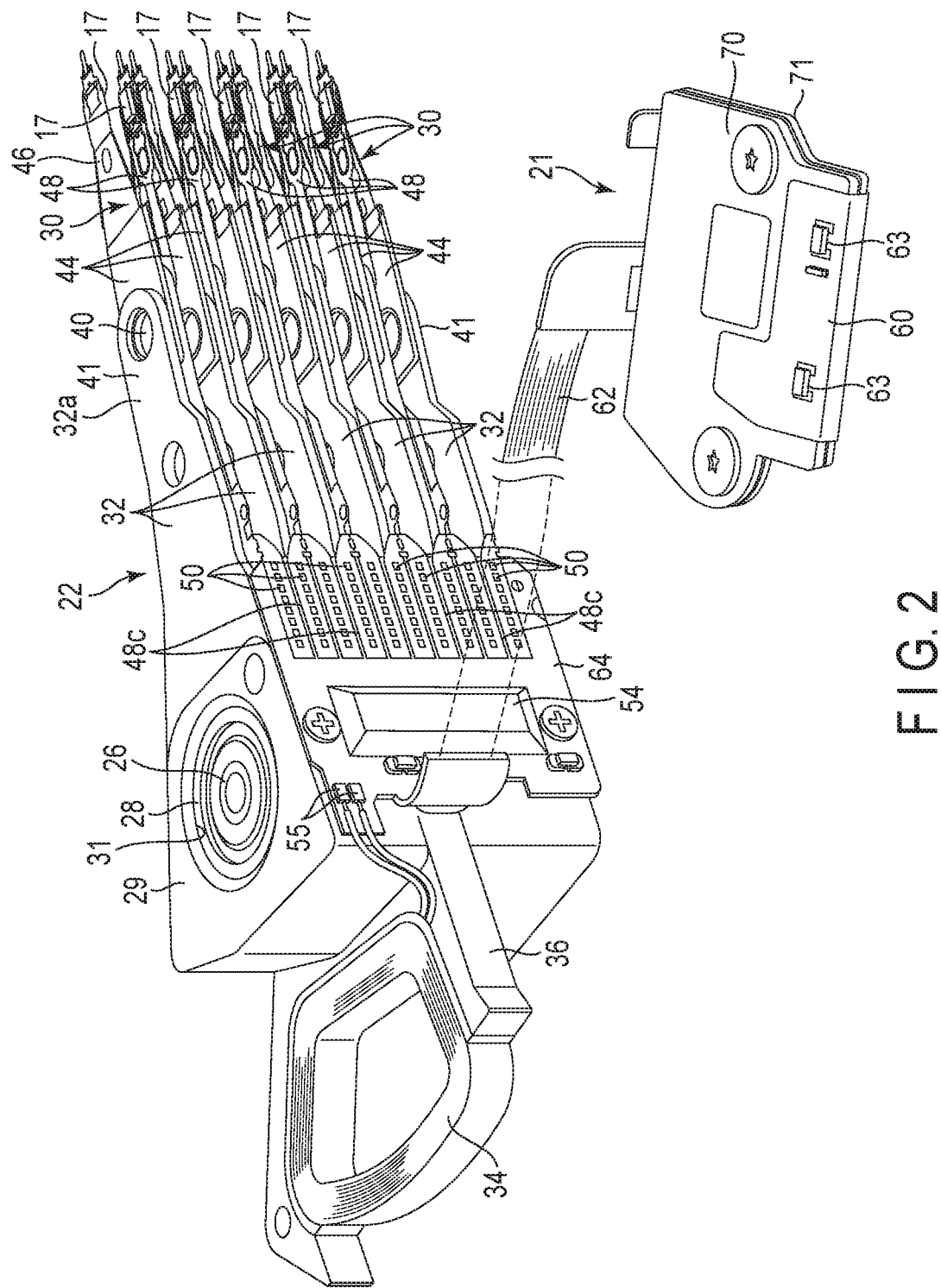
FIG. 2 is a perspective view of an actuator assembly and a board unit (FPC unit) of the HDD.

FIG. 2 is a perspective view of the actuator assembly and the FPC unit and FIG. 3 is a perspective view of the suspension assembly. As shown in FIG. 2, the actuator assembly 22 includes the actuator block 29 having a through hole 31, the bearing unit (unit bearing) 28 provided in the through hole 31, the plurality of (e.g., six) arms 32 extending from the actuator block 29, the suspension assemblies 30 mounted to the respective arms 32, and the magnetic heads 17 supported on the suspension assemblies 30. The actuator block 29 is supported by the bearing unit 28 to be rotatable about the support shaft (pivot) 26 standing on the bottom wall 12a.

In the present embodiment, the actuator block 29 and the six arms 32 are integrally molded of aluminum or the like to form what is called "E-block". The arms 32 are formed in long and narrow flat plate shapes, for example, and extend from the actuator block 29 in a direction perpendicular to the support shaft 26. The six arms 32 are arranged at intervals to be parallel to each other.

The actuator assembly 22 has a support frame 36 extending from the actuator block 29 in an opposite direction from the arms 32 and the support frame 36 supports a voice coil 34 that forms a part of the VCM 24. As shown in FIG. 1, the voice coil 34 is positioned between paired yokes 38, one of which is fixed onto the base 12, and forms the VCM 24 with the yokes 38 and a magnet fixed to one of the yokes.

The actuator assembly 22 comprises the ten suspension assemblies 30 that respectively support the magnetic heads 17 and the suspension assemblies 30 are respectively mounted to distal end portions 32a of the respective arms 32. The plurality of suspension assemblies 30 include up-head suspension assemblies that support the magnetic heads 17 face up and down-head suspension assemblies that support the magnetic heads 17 face down. The up-head suspension assemblies and the down-head suspension assemblies are formed by arranging the suspension assemblies 30 with the same structures while changing vertical orientations of the suspension assemblies 30.

In the present embodiment, in FIG. 2, the down-head suspension assembly 30 is mounted to the uppermost arm 32 and the up-head suspension assembly 30 is mounted to the lowermost arm 32. To the four middle arms 32, the up-head suspension assemblies 30 and the down-head suspension assemblies 30 are mounted, respectively.

As shown in FIG. 3, the suspension assembly 30 comprises a base plate 44 in a substantially rectangular shape, a load beam 46 in a shape of a long and narrow leaf spring, and a flexure (wiring member) 48 in a long and narrow band shape. A proximal end portion of the load beam 46 is overlaid on and fixed to an end portion of the base plate 44. The load beam 46 extends from the base plate 44 and tapers toward an extended end. The base plate 44 and the load beam 46 are made of stainless steel, for example.

The base plate 44 has, in a proximal end portion thereof, a circular opening and an annular protruding portion 51 positioned at a periphery of the opening. The base plate 44 is fastened to the distal end portion 32a of the arm 32 by fitting the protruding portion 51 of the base plate 44 in a crimp hole 40 formed in the distal end portion 32a of the arm 32 and crimping the protruding portion 51 (see FIG. 2). The proximal end portion of the load beam 46 is overlaid on the distal end portion of the base plate 44 and fixed to the base plate 44 by welding at a plurality of positions.

The flexure 48 of the suspension assembly 30 is a layered plate in a long and narrow band shape and having a metal plate (backing layer) made of stainless steel or the like and serving as a base and a flexible printed circuit board (FPC) disposed on the metal plate.

The flexure 48 has a distal end side portion 48a and a proximal end side portion 48b. The distal end side portion 48a is mounted to the load beam 46 and the base plate 44. The proximal end side portion 48b extends outward from a side edge of the base plate 44 and further extends along the arm 32 to a proximal end portion (the actuator block 29) of the arm 32.

The flexure 48 has a distal end portion positioned on the load beam 46 and a gimbal portion (resilient support portion) 52 that is formed at the distal end portion and can be displaced. The magnetic head 17 is mounted to the gimbal portion 52. Paired piezoelectric elements 53 forming microactuators are mounted to the gimbal portion 52 and disposed on opposite sides of the magnetic head 17. The distal end portion of the flexure 48 is electrically connected to the read head element, the write head element, the heater, the assisting element, an HDI sensor, and other members of the magnetic head 17 and the piezoelectric elements 53 via wirings and connection pads (not shown).

The flexure 48 includes the connection end portion (tail connection terminal portion) 48c provided to one end of the proximal end side portion 48b. The connection end portion 48c is formed in a long and narrow rectangular shape. The connection end portion 48c is bent at a substantially right angle to the proximal end side portion 48b to be positioned substantially perpendicularly to the arm 32. The plurality of (e.g., thirteen) connection terminals (connection pads) 50 are provided to the connection end portion 48c. The connection terminals 50 are respectively connected to the wirings of the flexure 48. In other words, the plurality of wirings of the flexure 48 extend throughout an almost entire length of the flexure 48 and are electrically connected at one ends to the magnetic head 17 and connected at the other ends to the connection terminals (connection pads) 50 of the connection end portion 48c.

As shown in FIG. 2, the ten suspension assemblies 30 extend from the six arms 32 and are arranged substantially parallel at predetermined intervals to face each other. The suspension assemblies 30 form the five down-head suspension assemblies and the five up-head suspension assemblies. The down-head suspension assembly 30 and the up-head suspension assembly 30 in each pair are positioned parallel with a predetermined clearance left therebetween and the magnetic heads 17 are positioned to face each other. The magnetic heads 17 are positioned to face opposite faces of the corresponding magnetic disk 18.

As shown in FIG. 2, the FPC unit 21 integrally has a base portion 60 in a substantially rectangular shape, a relay portion 62 in a long and narrow band shape and extending from one side edge of the base portion 60, and a joint portion (FPC joint portion) 64 in a substantially rectangular shape and provided continuously with a distal end portion of the relay portion 62. The base portion 60, the relay portion 62, and the joint portion 64 are formed by flexible printed circuit boards (FPCs).

On one of surfaces (an outer face) of the base portion 60, the electronic components such as the conversion connector (not shown) and a plurality of capacitors 63 are mounted and electrically connected to wirings (not shown). To the other surfaces (inner faces) of the base portion 60, two metal plates 70, 71 that serve as reinforcing plates are respectively bonded. The base portion 60 is disposed on the bottom wall 12a of the housing 10 and fixed to the bottom wall 12a by use of two screws. The conversion connector on the base portion 60 is connected to the control circuit board provided on the bottom face side of the housing 10.

The relay portion 62 extends from the base portion 60 toward the actuator assembly 22. The joint portion 64 provided to an extended end of the relay portion 62 is formed in the rectangular shape having substantially equal height and width to a side face (mounting face) of the actuator block 29. The joint portion 64 is bonded to the mounting face of the actuator block 29, with a backing plate made of aluminum or the like interposed therebetween, and fixed to the mounting face by use of fixing screws.

The connection end portions 48c of the ten flexures 48 are joined to a plurality of connection portions of the joint portion 64 and electrically connected to wirings of the joint portion 64. The plurality of connection end portions 48c are arranged in a direction parallel to the support shaft 26. A head IC (head amplifier) 54 is mounted on the joint portion 64 and the head IC 54 is connected to the connection end portions 48c and the base portion 60 by the wirings of the FPC. Furthermore, the joint portion 64 has a pair of connection pads 55 and the voice coil 34 is connected to the connection pads 55.

The ten magnetic heads 17 of the actuator assembly 22 are electrically connected to the base portion 60 via the wirings of the flexures 48, the connection end portions 48c, the joint portion 64 of the FPC unit 21, and the relay portion 62, respectively. Moreover, the base portion 60 is electrically connected to the printed circuit board on the bottom face side of the housing 10 via the conversion connector.

A wiring structure of the FPC joint portion 64 will be described in detail. FIG. 4 is a side view of the joint portion 64 mounted on the actuator block and the plurality of connection end portions and FIG. 5 is a side view of the joint portion 64 before the connection end portions are joined.

Figure 5:
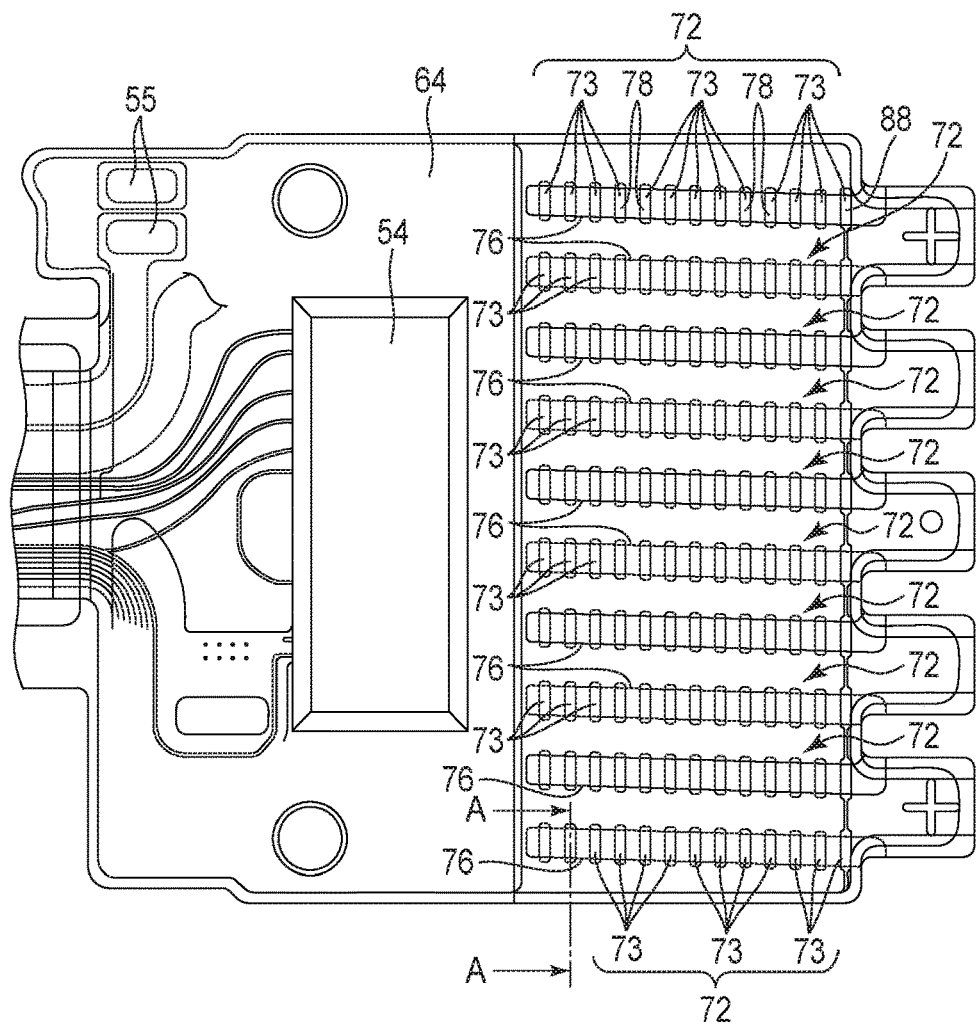
FIG. 5 is a front view of the joint portion of the FPC unit.

As shown in FIG. 5, the joint portion 64 of the FPC has ten connection pad groups 72 corresponding to the connection end portions 48c of the suspension assemblies 30. Each of the connection pad groups 72 includes thirteen connection pads 73, for example, arranged in a row, and each of the connection pads 73 is electrically connected to the base portion 60 by the wiring. The thirteen connection pads 73 of each group 72 are arranged at predetermined intervals in a direction substantially parallel to the arm 32. The ten connection pad groups 72 are arranged at intervals and substantially parallel to each other in the direction parallel to the support shaft 26, i.e., a height direction of the actuator block 29. The connection pads 73 are positioned in an opening 76 in a band shape and formed in a cover insulating layer (described later) of the FPC and are exposed to an outside through the opening 76. Before the connection end portions 48c are joined, solder layers 78 are formed on the respective connection pads 73.

As shown in FIGS. 4 and 5, the joint portion 64 of the FPC is fixed to the mounting face of the actuator block 29 with the backing plate interposed therebetween. The connection end portions 48c of the flexures 48 are overlaid on the respective connection pad groups 72 of the joint portion 64. The connection terminals 50 of the connection end portions 48c respectively come in contact with the corresponding connection pads 73 with the solder layers 78 interposed therebetween. As will be described later, the respective connection terminals 50 of the connection end portions 48c are mechanically and electrically solder-joined to the corresponding connection pads 73 by melting of the solder layers 78 with laser irradiation.

Next, a structure of each of the flexures 48 and details of a structure of each of the connection end portions 48c will be described.

Figure 6:
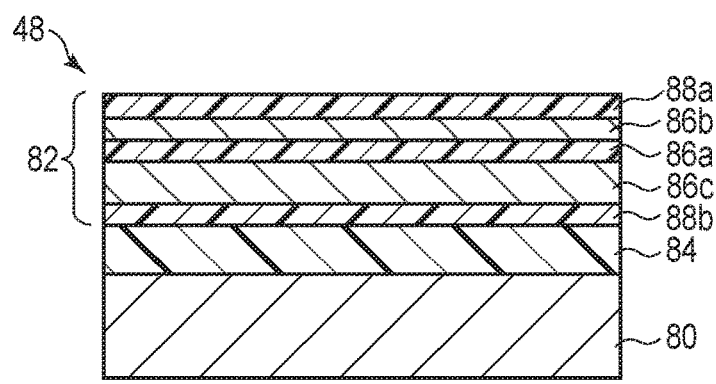
FIG. 6 is a sectional view of the flexure.

FIG. 6 is a sectional view of a layered structure of the flexure 48 and FIG. 7 is an enlarged plan view of the connection end portion.

As shown in FIG. 6, the flexure 48 comprises a metal plate (backing layer) 80 made of stainless steel or the like and serving as a base, and a flexible printed circuit board (FPC) 82 provided on the metal plate. In the present embodiment, a heat insulation layer 84 is provided between the metal plate 80 and the FPC 82. The FPC 82 is formed by a multilayered body having a base insulating layer 86a, conductive layers 86b, 86c respectively layered on opposite faces of the base insulating layer 86a, and cover insulating layers (protective layers) 88a, 88b overlaid and layered on the respective conductive layers. The conductive layers 86b, 86c are formed of sheets of cupper foil, for example, and a plurality of wirings, connection terminals, and connection pads are formed by patterning the copper foil. The FPC 82 is not limited to the multilayer structure. It is also possible to use an FPC having a single-layer structure including a base insulating layer, a single conductive layer, and cover insulating layers. The heat insulation layer 84 can be omitted.

As shown in FIG. 7, the connection end portion 48c of the flexure 48 is formed in the long and narrow substantially rectangular shape. The connection end portion 48c has an opening 90 in a rectangular shape and formed in a central portion of the connection end portion. The opening 90 is formed to have a longitudinal length L of 6 mm or less and a width W of 0.5 mm, for example. The above-described thirteen connection terminals 50 are positioned in the opening 90 and arranged at intervals in a longitudinal direction of the opening 90. Each of the connection terminals 50 extends from one end to the other end of the opening 90 in a width direction. The respective connection terminals 50 are electrically connected to the connection pads at the distal end portion of the flexure 48 by the wirings S, respectively.

A width WT of the connection terminal 50 is 0.2 mm, for example. Each of the intervals between the connection terminals 50 is 0.15 mm or wider. A through hole is formed in a central portion of each of the connection terminals 50. A percentage of an area of the opening 90 occupied by the sum of areas of all the connection terminals 50 (including the through holes) is 40% or more, for example, 43%.

The intervals between the connection terminals 50 may be equal to each other. In the present embodiment, however, from an extended end side of the connection end portion 48c, a wider interval 90a (of 0.3 mm, for example) is disposed after every third connection terminal 50. The wider intervals 90a are provided so that a jig can be disposed at the wider intervals 90a in solder-joining of the connection terminals 50.

In the present embodiment, the thirteen connection terminals 50 are arranged in the following order in consideration of an influence of crosstalk. In an example, from the extended end side of the connection end portion 48c, the four connection terminals 50(R) for the read head, the two connection terminals 50(S) for the HDI sensor, the two connection terminals 50(A) for the assisting element (the high frequency assisting element or the heat assisting element), the two connection terminals 50(H) for the heater, the two connection terminals 50(W) for the write head, and lastly the one connection terminal 50(G) for the gimbal micro-actuators (GMA) (piezoelectric elements 53) are arranged in this order. In other words, the sixth and seventh connection terminals 50(A) (from a proximal end side) for the assisting element are disposed at a central portion in an arranged direction, the connection terminals 50(W) for the write head are disposed on the proximal end side of the connection end portion 48c, and the connection terminals 50(H) for the heater are provided between the connection terminals 50(A) for the assisting element and the connection terminals 50(W) for the write head. The connection terminals 50(R) for the read head are disposed on the distal end side of the connection end portion 48c and the connection terminals 50(S) for the HDI sensor is provided between the connection terminals 50(A) for the assisting element and the connection terminals 50(R) for the read head.

With the above-described arrangement, it is possible to widen the interval between the connection terminals 50(W) for the write head and the connection terminals 50(A) for the assisting element and the interval between the connection terminals 50(R) for the read head and the connection terminals 50(A) for the assisting element to thereby prevent the crosstalk between the terminals in driving. By providing the connection terminals 50(W) for the write head at the proximal end portion of the connection end portion 48c, it is possible to minimize lengths of the wirings between the connection terminals 50(W) and the magnetic head 17, which reduces an impedance of the wiring. The arrangement of the connection terminals 50 is not limited to the above-described arrangement. To avoid the crosstalk, the connection terminals 50 may be arranged such that the connection terminals for the write head and the connection terminals for the read head are not adjacent to the connection terminals for the assisting element.

Each of the connection end portions 48c formed as described above is disposed on the joint portion 64 of the FPC unit as shown in FIG. 4 and the thirteen connection terminals 50 are overlaid on the corresponding connection pads 73. If the respective connection terminals 50 and the connection pads 73 are irradiated with laser, the solder layers 78 printed on the connection pads 73 and the connection terminals 50 directly absorb heat. As a result, insulating layers on the connection terminals 50 and the solder layers 78 melt and the connection terminals 50 and the connection pads 73 are solder-joined to each other. Thus, the connection end portion 48c and the joint portion 64 are electrically and mechanically joined to each other and conductivity between the connection end portion 48c and the joint portion 64 is secured.

Figure 8:
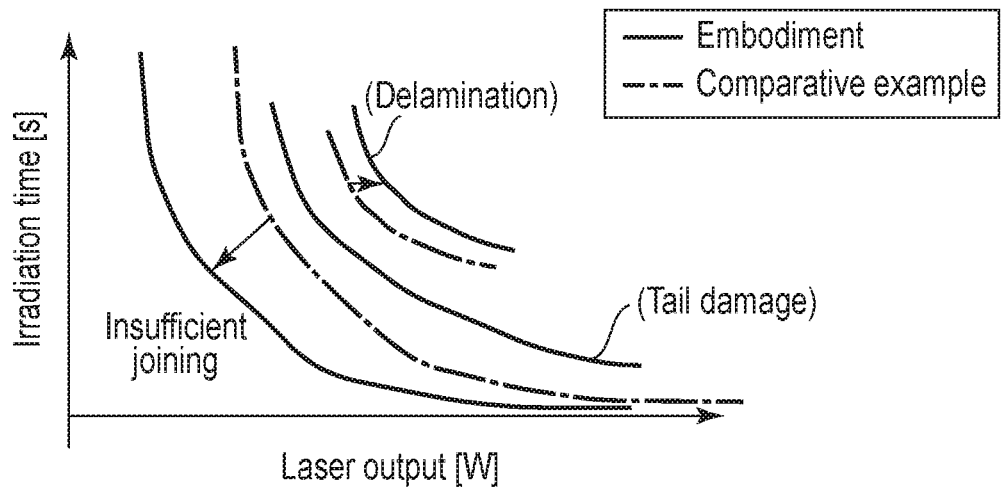
FIG. 8 is a graph for comparing relationships between a laser output, an irradiation time, and a joined state in solder-joining the tail connection end portion (without a heat insulation layer) with those in a comparative example.
Figure 9:
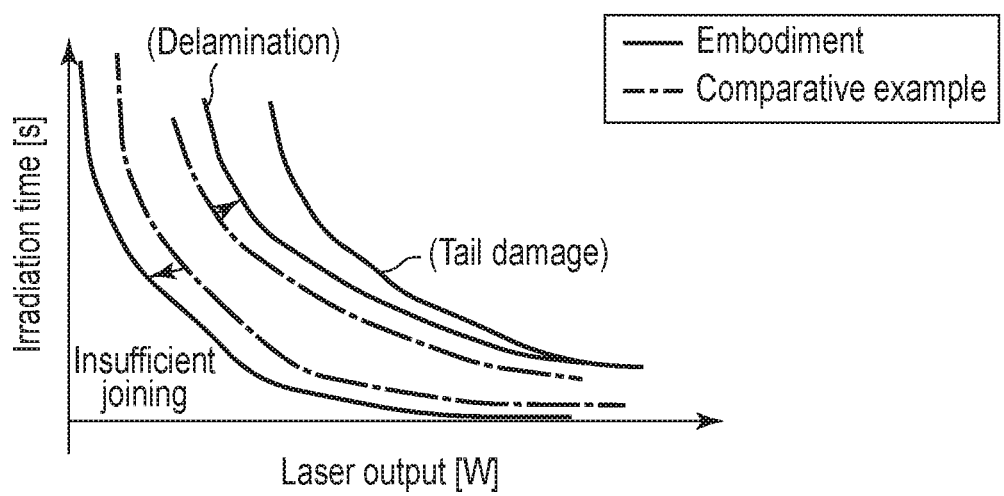
FIG. 9 is a graph for comparing relationships between a laser output, an irradiation time, and a joined state in solder-joining the tail connection end portion (with the heat insulation layer) with those in a comparative example.

FIG. 8 is a graph for comparing relationships between a laser output, an irradiation time, and joined states in solder-joining the tail connection end portion (without the heat insulation layer) with those in a comparative example. FIG. 9 is a graph for comparing relationships between a laser output, an irradiation time, and joined states in solder-joining the tail connection end portion (with the heat insulation layer) with those in a comparative example. As each of the comparative examples, a tail connection end portion having nine connection terminals provided in an opening is used.

In each of the comparative examples, intervals between the nine connection terminals are wide and a percentage of an area of the opening occupied by the sum of areas of all the connection terminals is about 35%. In this case, as shown by a one-dot chain line in FIG. 8, in the comparative example, it is necessary to increase the laser output (an amount of heat) of the laser irradiation in order to secure a necessary amount of heat to melt the solder. The larger amount of heat is necessary to secure the necessary amount of heat to melt the solder. As a result, an allowable temperature of the insulating layers (polyimide) of the connection end portion that receive the heat is exceeded and the polyimide burns or changes in color. Therefore, in the comparative example, damage to the connection end portion (tail damage) causes a reduction in a margin of the laser output.

On the other hand, if the heat insulation layer is provided to each of the flexures to suppress escape of heat from the connection end portion 48c to the joint portion 64 of the FPC, solder joining can be carried out with a lower laser output, which reduces a risk of the tail damage in the comparative example as shown in FIG. 9, while the heat is trapped in the joint portion 64 and a temperature increase is likely to occur. Therefore, delamination becomes likely to occur between the conductive layers and the insulating layers in vias positioned near the connection terminals. The delamination varies depending on a moisture absorbing state of the FPC and causes the reduction in the margin of the laser output.

On the other hand, by providing the thirteen connection terminals 50 in the opening 90 at the connection end portion (tail connection end portion) 48c according to the present embodiment, a percentage of the area of the opening 90 occupied by the sum of areas of the connection terminals 50 increases to 40% or higher. As a result, in melting the solder, heat is less likely to escape and it is possible to efficiently absorb the heat of the laser. Without the heat insulation layer, in the case of the connection end portion 48c according to the present embodiment, it is possible to reduce a minimum laser output necessary for the solder joining to thereby widen a margin of the laser output before the tail damage is caused as shown by a solid line in FIG. 8 as compared with the comparative example. At the same time, as compared with the comparative example, it is possible to widen a margin before the delamination is caused.

With the heat insulation layer, in the case of the connection end portion 48c according to the present embodiment, it is possible to reduce the minimum laser output and it is possible to increase the laser output before the delamination is caused to thereby increase the margin of the laser output as shown by a solid line in FIG. 9 as compared with the comparative example.

If the intervals between the connection terminals 50 are narrower than or equal to 0.15 mm in the connection end portion 48c, manufacture of the connection terminals 50 becomes difficult and a risk of a short circuit between the terminals increases. An example of the arrangement of the thirteen terminals with which the risk of the short circuit can be avoided and the percentage occupied by the areas of the connection terminals 50 can be maximized is a structure with the opening 90 having a length L of 6 mm, intervals of 0.15 mm between the connection terminals 50, and terminal widths WT of 0.3 mm. In this case, a percentage of an area of the opening 90 occupied by areas of the connection terminals 50 is about 65% and therefore the areas of the connection terminals 50 preferably occupy 65% or less of the opening 90. An example with which the risk of the short circuit can be avoided and the number of the arranged connection terminals can be maximized is a structure in which the seventeen connection terminals 50 having terminal widths WT of 0.2 mm are arranged at intervals of 0.15 mm in the opening 90 having a length L of 6 mm. In this case, a percentage of an area of the opening 90 occupied by areas of the connection terminals 50 is about 56%. Therefore, the areas of the connection terminals 50 preferably occupy 56% or less of the opening area.

As shown in FIG. 1, when the actuator assembly 22 and the FPC unit 21 formed as described above are mounted into the base 12, the actuator assembly 22 is supported to be able to turn about the support shaft 26. Each of the magnetic disks 18 is positioned between the two suspension assemblies 30. During operation of the HDD, the magnetic heads 17 mounted to each of the suspension assemblies 30 face the upper face and the lower face of each of the magnetic disks 18, respectively. The base portion 60 of the FPC unit 21 is fixed to the bottom wall 12a of the base 12.

With the HDD and the suspension assemblies formed as described above, by disposing the thirteen connection terminals 50 in the opening 90 having the predetermined length L at the connection end portion 48c of each of the flexures 48, the percentage of the area of the opening 90 occupied by the areas of the connection terminals 50 is set to 40% to 65% inclusive. Thus, in solder-joining the connection terminals 50, the heat is less likely to escape and it is possible to efficiently absorb the heat of a heating unit. Therefore, it is possible to widen the margin of the output of the heating unit before the tail damage and the delamination are caused to thereby carry out stable solder joining without causing the tail damage and the delamination.

From the above, according to the first embodiment, it is possible to increase the number of the connection terminals without expanding an area in which the connection terminals are mounted and it is possible to provide the large-capacity and high-performance magnetic disk device and the suspension assemblies.

Next, suspension assemblies of HDDs according to the other embodiments will be described. In the other embodiments described below, the same portions as those in the above-described first embodiment will be provided with the same reference signs and will not be described in detail or will be described briefly and portions different from those in the first embodiment will be mainly described.

Second Embodiment

FIG. 10 is an enlarged plan view of a connection end portion of a flexure used for the suspension assembly according to the second embodiment. As shown in FIG. 10, according to the second embodiment, the connection end portion 48c has fourteen connection terminals 50 arranged in an opening 90 having a length L of about 6 mm. A width WT of each of the connection terminals 50 is set to 0.2 mm as in the first embodiment. In the present embodiment, the one connection terminal 50(G) for micro-actuators (piezoelectric elements) is added. The connection terminal 50(G) is disposed at a closest end portion of the opening 90 to a proximal end. The other thirteen connection terminals 50 are arranged in the same way as in the first embodiment.

If the fourteen terminals are provided, areas of all the connection terminals 50 occupy about 47% of an area of the opening 90. Therefore, in the second embodiment, similar functions and effects to those in the above-described first embodiment can be obtained.

In solder joining with laser, heat is less likely to escape around and a temperature is likely to increase at positions closer to a central portion in a longitudinal direction of the tail connection end portion 48c while the heat is more likely to escape outside the connection end portion 48c and the temperature is less likely to increase at positions closer to end portions in the longitudinal direction. Because a portion closer to an extended end side (distal end side) of the connection end portion 48c is positioned closer to a center of an actuator block to which the connection end portion 48c is joined, the heat is likely to escape from the connection end portion 48c to the actuator block at such portion.

Therefore, in the following embodiments, widths of connection terminals 50 or intervals between the terminals are varied so that a temperature of the connection end portion 48c can be increased uniformly in solder joining.

Third Embodiment

FIG. 11A is a schematic plan view of a tail connection end portion of a flexure according to the third embodiment. As shown in FIG. 11A, according to the third embodiment, intervals W1 between connection terminals 50 positioned at opposite end portions in a longitudinal direction of the connection end portion 48c are set to be narrower than an interval W2 between connection terminals 50 positioned at a central portion in the longitudinal direction (W2>W1). Here, the intervals W1 between the connection terminals 50 on opposite end sides are set to be narrower than intervals between the other connection terminals 50. In an example, the interval W2 is about 0.15 mm and the intervals W1 are about 0.08 mm.

The intervals between the terminals may be formed to gradually narrow from the connection terminals at the central portion toward the connection terminals at the opposite end portions.

Fourth Embodiment

FIG. 11B is a schematic plan view of a tail connection end portion of a flexure according to a fourth embodiment. As shown in FIG. 11B, according to the fourth embodiment, only an interval W1 between two connection terminals 50 positioned at an extended end of the connection end portion 48c is formed to be narrower than intervals W2 between other connection terminals 50. Alternatively, the intervals between the connection terminals 50 may be formed to gradually narrow from a proximal end side (suspension side) of the connection end portion 48c toward a distal end portion.

Fifth Embodiment

FIG. 12A is a schematic plan view of a tail connection end portion of a flexure according to a fifth embodiment. As shown in FIG. 12A, according to the fifth embodiment, widths WT2 of connection terminals 50 positioned at opposite end portions in a longitudinal direction of the connection end portion 48c are set to be larger than widths WT1 of connection terminals 50 positioned at a central portion in the longitudinal direction (WT2>WT1). Here, the widths WT2 of the connection terminals 50 on opposite end sides are set to be larger than the widths WT1 of the other connection terminals 50. In an example, the widths WT2 are about 0.3 mm and the widths WT1 are about 0.2 mm.

The widths WT of the connection terminals 50 may be formed to gradually increase from the connection terminals 50 at the central portion toward the connection terminals 50 at the opposite end portions.

Sixth Embodiment

FIG. 12B is a schematic plan view of a tail connection end portion of a flexure according to a sixth embodiment. As shown in FIG. 12B, according to the sixth embodiment, only a width WT2 of a connection terminal 50 positioned at an extended end of the connection end portion 48c is formed to be larger than widths WT1 of other connection terminals 50. Alternatively, the widths WT of the connection terminals 50 may be formed to gradually increase from a proximal end side (suspension side) of the connection end portion 48c toward the extended end.

According to the above-described third to sixth embodiments, it is possible to uniformly increase a temperature of the connection end portion 48c in solder joining. In the embodiments, other structures of the connection end portion 48c are similar to those of the connection end portion 48c in the above-described first embodiment. Therefore, in the third to sixth embodiments, similar functions and effects to those in the first embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The number of the magnetic disks is not limited to five and may be four or smaller or six or larger. The number of the suspension assemblies and the number of the magnetic heads may be increased or decreased in accordance with the number of the mounted magnetic disks. In the connection end portion of each of the suspension assemblies, the shapes, the sizes, and the like of the connection terminals are not limited to those in the above-described embodiments and can be changed in various ways as necessary. Kinds and functions of the connection terminals are not limited to those in the above-described embodiments and can be changed in various ways in accordance with functions of the magnetic heads and the suspension assemblies.

What is claimed is:

1. A suspension assembly comprising:
   a support plate;
   a wiring member disposed on the support plate; and
   a head supported on the support plate through the wiring member, wherein
   the wiring member comprises a distal end portion electrically connected to the head, a connection end portion extending outside the support plate, and a plurality of wirings extending between the distal end portion and the connection end portion, and
   the connection end portion includes an opening with predetermined length and width and thirteen or more connection terminals disposed in the opening and arranged at intervals in a direction of the length, and a percentage of an area of the opening occupied by a sum of areas of the thirteen or more connection terminals is 40% to 65% inclusive.

2. The suspension assembly of claim 1, wherein
   the connection end portion comprises fourteen or more connection terminals disposed in the opening and the sum of the areas of the fourteen or more connection terminals occupies 47% or more of the area of the opening.

3. The suspension assembly of claim 1, wherein
   the thirteen or more connection terminals include connection terminals for a write head, connection terminals for a read head, connection terminals for an assisting element, connection terminals for a heater, connection terminals for an HDI sensor, and connection terminals for a micro-actuator,
   the connection terminals for the HDI sensor or the connection terminals for the heater are disposed between the connection terminals for the assisting element and the connection terminals for the read head, and
   the connection terminals for the HDI sensor or the connection terminals for the heater are disposed between the connection terminals for the assisting element and the connection terminals for the write head.

4. The suspension assembly of claim 1, wherein
   the thirteen or more connection terminals are arranged such that intervals between the connection terminals positioned at one end portion in the direction of the length of the opening are narrower than intervals between the connection terminals positioned at a central portion in the direction of the length of the opening.

5. The suspension assembly of claim 1, wherein
   the thirteen or more connection terminals are arranged such that intervals between the connection terminals positioned at one end portion in the direction of the length of the opening are narrower than intervals between the other connection terminals.

6. The suspension assembly of claim 1, wherein
   a width of the connection terminal positioned at an end portion in the direction of the length of the opening is larger than a width of the connection terminal positioned at a central portion in the direction of the length of the opening.

7. The suspension assembly of claim 1, wherein
a width of the connection terminal positioned at one end portion in the direction of the length of the opening is larger than a width of the other connection terminals.

8. A disk device comprising:
a disk-shaped recording medium; and
the suspension assembly of claim 1.

9. The disk device of claim 8, wherein
the connection end portion comprises fourteen or more connection terminals disposed in the opening and the sum of the areas of the fourteen or more connection terminals occupies 47% or more of the area of the opening.

10. The disk device of claim 8, wherein
the thirteen or more connection terminals include connection terminals for a write head, connection terminals for a read head, connection terminals for an assisting element, connection terminals for a heater, connection terminals for an HDI sensor, and connection terminals for a micro-actuator,
the connection terminals for the HDI sensor or the connection terminals for the heater are disposed between the connection terminals for the assisting element and the connection terminals for the read head, and
the connection terminals for the HDI sensor or the connection terminals for the heater are disposed between the connection terminals for the assisting element and the connection terminals for the write head.

11. The disk device of claim 8, wherein
the thirteen or more connection terminals are arranged such that intervals between the connection terminals positioned at one end portion in the direction of the length of the opening are narrower than intervals between the connection terminals positioned at a central portion in the direction of the length of the opening.

12. The disk device of claim 8, wherein
the thirteen or more connection terminals are arranged such that intervals between the connection terminals positioned at one end portion in the direction of the length of the opening are narrower than intervals between the other connection terminals.

13. The disk device of claim 8, wherein
a width of the connection terminal positioned at an end portion in the direction of the length of the opening is larger than a width of the connection terminal positioned at a central portion in the direction of the length of the opening.

14. The disk device of claim 8, wherein
a width of the connection terminal positioned at one end portion in the direction of the length of the opening is larger than a width of the other connection terminals.

* * * * *